United States Patent
Laurent et al.

(10) Patent No.: US 7,610,528 B2
(45) Date of Patent: Oct. 27, 2009

(54) CONFIGURING FLASH MEMORY

(75) Inventors: Marc Laurent, Nantes (FR); Frode Milch Pedersen, Trondheim (NO)

(73) Assignee: ATMEL Corporation, San Jose, CA (US)

( * ) Notice: Subject to any disclaimer, the term of this patent is extended or adjusted under 35 U.S.C. 154(b) by 345 days.

(21) Appl. No.: 11/353,873

(22) Filed: Feb. 14, 2006

(65) Prior Publication Data

US 2007/0192657 A1 Aug. 16, 2007

(51) Int. Cl.
*G01R 31/28* (2006.01)
*G11C 29/00* (2006.01)
*G11C 7/00* (2006.01)

(52) U.S. Cl. .......................... 714/724; 714/718; 365/201

(58) Field of Classification Search ................. 714/718, 714/724, 727, 733, 742; 365/201
See application file for complete search history.

(56) References Cited

U.S. PATENT DOCUMENTS

| | | | |
|---|---|---|---|
| 5,297,148 A * | 3/1994 | Harari et al. ................. | 714/710 |
| 5,761,215 A | 6/1998 | McCarthy et al. | |
| 6,041,378 A | 3/2000 | Warren | |
| 6,041,406 A | 3/2000 | Mann | |
| 6,076,177 A * | 6/2000 | Fontenot et al. ............. | 714/724 |
| 6,243,842 B1 | 6/2001 | Slezak et al. | |
| 6,493,839 B1 | 12/2002 | Miner | |
| 6,510,488 B2 | 1/2003 | Lasser | |
| 6,543,019 B2 | 4/2003 | Kniffler et al. | |
| 6,754,868 B2 | 6/2004 | Bristow et al. | |
| 6,876,591 B2 | 4/2005 | Gappisch et al. | |
| 6,925,583 B1 | 8/2005 | Khu et al. | |
| 6,948,147 B1 | 9/2005 | New et al. | |
| 7,340,658 B2 | 3/2008 | Seuring | |
| 2007/0192657 A1 * | 8/2007 | Laurent et al. ............... | 714/720 |

OTHER PUBLICATIONS

Wong, Bill, "Flash Memory and MCUs: A Match Made in Heaven," Basics of Design, A Supplement to Electronic Design/Mar. 15, 2005 (8 pages).
Cypress Semiconductor Corporation, "Using IEEE 1149.1 Boundary Scan (JTAG) With Cypress Ultra37000™ CPLDs," Nov. 18, 1998 (11 pages).
"AVR105: Power Efficient High Endurance Parameter Storage in Flash Memory," Rev. 2546A-AVR-09/03, 6 pages.
"AVR106: C functions for reading and writing to Flash memory," Rev. 2575A-AVR-08/04, 10 pages.
"AVR107: Interfacing AVR serial memories," Rev. 2595A-AVR-03/05, 22 pages.

(Continued)

*Primary Examiner*—Cynthia Britt
(74) *Attorney, Agent, or Firm*—Fish & Richardson P.C.

(57) ABSTRACT

A system for configuring or testing memory may cycle a memory array while substantially concurrently performing other functional testing. In particular implementations, the system may configure, or cycle, a flash memory using a serial interface and test other functional units using the same serial interface substantially concurrently with cycling the flash memory. In some implementations, cycling the flash memory includes erasing and writing to the flash memory in specific patterns in order to dissipate charge that may have accumulated during a fabrication process.

19 Claims, 4 Drawing Sheets

OTHER PUBLICATIONS

"AVR108: Setup and Use of the LPM Instruction," Rev. 1233B-AVR-05/02, 4 pages.

"AVR109: Self Programming," Rev. 1644G-AVR-06/04, 11 pages.

"AVR910: In-System Programming," Rev. 0943C-11/00, 10 pages.

"AVR911: AVR Open Source Programmer," Rev. 2568A-AVR-07/04, 13 pages.

"8-bit AVR® with 8K Bytes In-System Programmable Flash—ATmega8—ATmega8L" 2418O-AVR-10/04, 305 pages.

* cited by examiner

CONFIGURING FLASH MEMORY

BACKGROUND

Nonvolatile memory devices generally include an array of MOS transistors, or "cells," having specialized gate structures that are designed to retain digital values, even in the absence of power to the device, by trapping or storing charge. Electronically erasable programmable read-only (EEPROM) memory devices and flash EEPROM devices ("flash") are two examples of nonvolatile memory devices. The term "EEPROM" is sometimes used to refer to devices that are generally programmable and erasable at a byte level, and "flash memory" is sometimes used to refer to devices that are generally programmable and erasable in sections larger than one byte.

The memory cells in a flash device are generally arranged in blocks referred to as "pages." Each page may store many bytes of data. For example, a 256 kilobyte (K) flash device may be arranged as 1024 pages where each page stores 256 bytes of data. As another example, a 256K flash device may be arranged as 512 pages, where each page stores 512 bytes of data. Bytes within a page may be individually addressable, or they may be organized as larger words (e.g., 2-byte words, 4-byte words, etc.) The memory cells in a flash device are generally programmed or erased at the page level. That is, data in an entire page may be erased simultaneously, rather than in a byte-by-byte manner. Similarly, an entire page of flash may be programmed simultaneously through the use of a volatile page buffer.

The volatile page buffer generally has the same capacity as an individual page of nonvolatile flash memory. For example, a flash device that is arranged in 256-byte pages will generally have a 256-byte page buffer. To write data to a flash device, the data may be first written to the page buffer. When the page buffer is filled and a page of flash memory specified, the entire page buffer may be written to the specified page of flash memory. The page buffer may then be erased, refilled and written to another page of flash memory. Because flash memory is generally written one page at a time, data should be written in a manner that is compatible with the internal page structure (number of pages, bytes per page, and word size) of the flash memory.

During fabrication of flash memory, charge may accumulate within individual memory cells. To initially configure a flash memory device for use, the flash memory device may be subjected to a configuration process to dissipate the accumulated charge and "reset" each cell of the flash memory device to an initial, predictable state, where both '0' and '1' logic values may be written and read back with sufficient internal voltage margins between the values. One method of initially configuring a flash memory device is to alternately erase and write a pattern to each page in the flash memory device. This sequence may be repeated a number of times.

Flash memory may be included in a stand-alone memory chip, or it may be embedded in a chip that provides functions beyond just storing data. For example, flash memory may be included in a microcontroller having a processing unit, registers, embedded memory, peripherals and various interface ports. Either a stand-alone flash memory chip or a device having embedded flash memory ma y be part of a larger circuit that includes, for example, a printed circuit board (PCB) and various other electrical components. A flash memory array may also be included in a package with other modules that make up a "system on a chip" (SOC).

At either a PCB level or at a die level, various components, including flash memory, may be tested or configured following the fabrication process. Testing or configuring a PCB or a die may include direct electrical stimulation of various pins on a device or connections ("nets") on a die to verify connectivity or functionality. Testing or configuration of a PCB or die may also include the use of specialized circuitry. For example, components of portions of a die may be tested or configured using a boundary scan testing protocol such as a protocol developed by the Joint Test Action Group (JTAG) and described in IEEE Standards 1149.1 and 1149.1A.

To facilitate boundary scan testing and configuration using boundary scan resources, portions of a die or various components on a PCB may be accessible from and serially connected to a Test Access Port (TAP), which may relay certain serial signals used by a boundary scan protocol. The signals may include for example, a clock signal, a mode signal, a serial input and a serial output (e.g., "TCLK," "TMS," "TDI" and "TDO"). By serially shifting in test command or configuration data via the mode signal, and serially shifting in test patterns or programming data via the serial input, an appropriate boundary scanning protocol may facilitate tests of connectivity between components, integrity of nets on a die, or certain functionality; or the boundary scan protocol may configure memory or some other configurable device.

SUMMARY

A system for configuring or testing memory may cycle a memory array while substantially concurrently performing other functional testing. In particular implementations, the system may configure or cycle a flash memory using a serial interface and test other functional units using the same serial interface substantially concurrently with cycling the flash memory. In some implementations, the serial interface may be replaced with a parallel interface. In some implementations, cycling the flash memory includes erasing and writing to the flash memory in specific patterns in order to dissipate charge that may have accumulated during a fabrication process.

In one implementation, a method is provided for testing an integrated circuit that has a serial interface, embedded memory, an embedded memory controller and at least one functional unit. The method includes receiving, from the serial interface, a first command to cycle the embedded memory. In response to receiving the first command, the embedded memory is cycled with the embedded memory controller. During the cycling of the embedded memory, a second command is received from the serial interface to test the at least one functional unit. The second command is executed to test the at least one functional unit substantially concurrently with the cycling of the embedded memory.

In another implementation, a method is provided for testing and configuring a device having at least a first integrated circuit and a second integrated circuit, where the first integrated circuit has embedded flash memory and an embedded flash memory controller and the first and second integrated circuits are coupled by a serial interface that connects to a device tester that is external to the device. The method includes receiving from the device tester and via the serial interface a command to configure the flash memory. The method further includes configuring the flash memory with the embedded flash memory controller; receiving test commands and test patterns from the device tester and via the serial interface; and executing the test commands and propagating the test patterns substantially concurrently with configuring the flash memory.

In some implementations, cycling or configuring the embedded memory includes executing one or more sequences of initiating erasure of the embedded memory and initiating the writing of data having a specific pattern to the embedded memory. The specific pattern may be an all 0s pattern, a checkerboard pattern, or an inverse-checkerboard pattern. Executing one or more sequences may include (a) initiating erasure of the embedded memory; (b) initiating the writing of data having a first pattern to the embedded memory; (c) initiating erasure of the embedded memory; (d) initiating the writing of data having a second pattern to the embedded memory, where the first pattern and the second pattern are different; and (e) repeating (a)-(d) a variable number of times.

In various implementations, a voltage level associated with initiating the writing of data may be measured. The variable number of times may be determined based on the measured voltage level. In some implementations, a determination may be made as to whether charge accumulated in the embedded memory during a fabrication process is substantially dissipated. The variable number of times may be based on the determination of whether the charge is substantially dissipated.

In some implementations, the serial interface is a boundary scan interface that complies with IEEE (Institute of Electrical and Electronic Engineers) Standard 1149.1 or 1149.1a. The embedded memory may be flash memory.

Advantages of the systems and techniques described herein may include any or all of the following. Embedded memory may be cycled concurrently with other testing, thereby reducing an overall initial test and configuration period for a device that includes the embedded memory. Cycling of the embedded memory may be initiated by a protocol that is not specific to the internal architecture of the embedded memory. Initial cycling and configuration of an embedded memory may be substantially automated.

These general and specific aspects may be implemented using a system, a method, or a computer program, or any combination of systems, methods, and computer programs. The details of one or more embodiments are set forth in the accompanying drawings and the description below.

DESCRIPTION OF DRAWINGS

These and other aspects will now be described in detail with reference to the following drawings.

Like reference symbols in the various drawings indicate like elements.

DETAILED DESCRIPTION OF EXEMPLARY EMBODIMENTS

Figure 1:
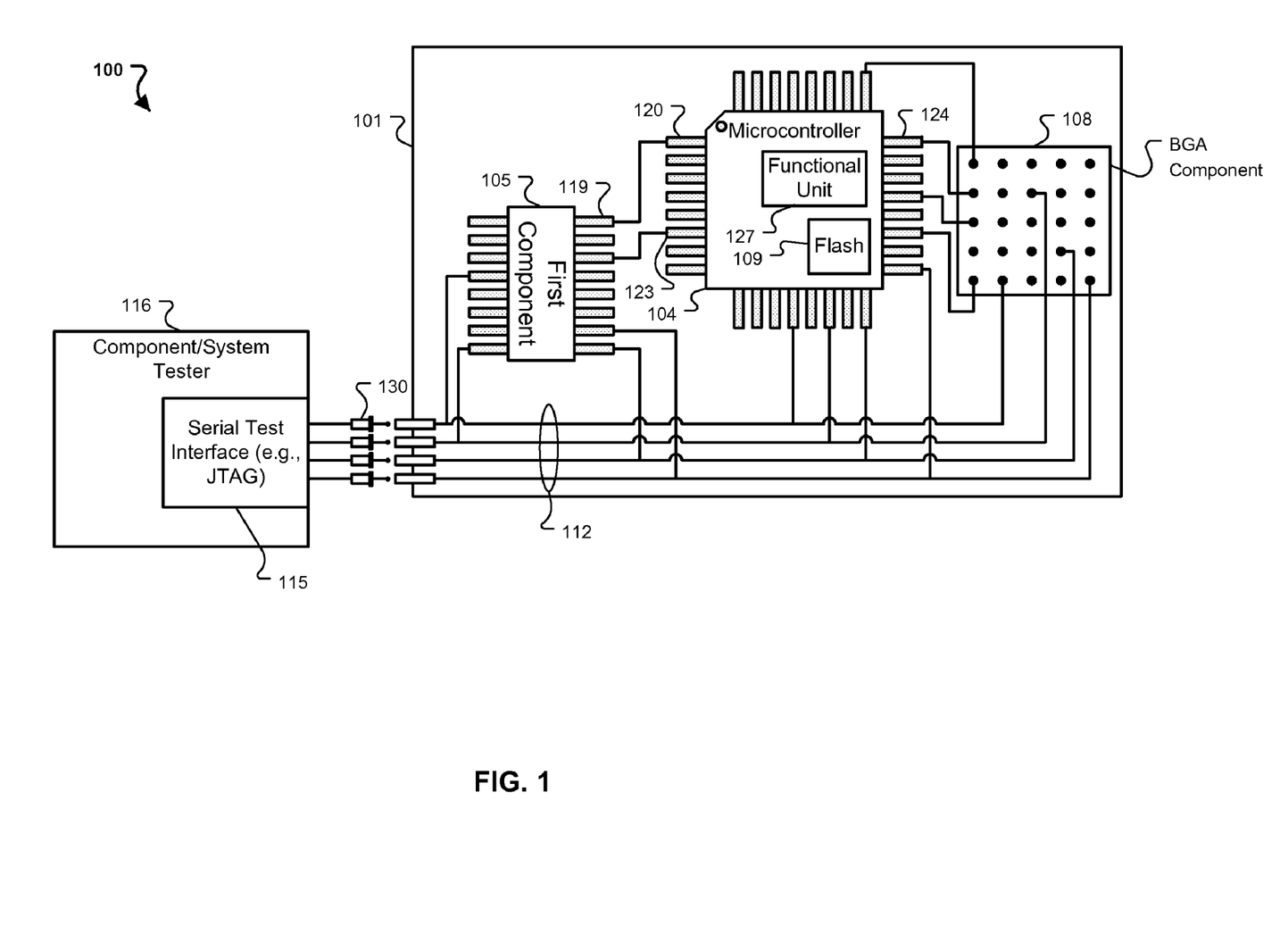
FIG. 1 is a block diagram illustrating a system in which embedded memory may be cycled concurrently with testing of one or more functional units.

FIG. 1 is a block diagram illustrating a system 100 in which embedded memory may be cycled concurrently with testing of one or more functional units. In particular, FIG. 1 illustrates a printed circuit board (PCB) 101 that includes integrated circuit components 104, 105 and 108 (hereinafter, "components"). As shown, the integrated circuit component 104 (e.g., a microcontroller and hereinafter referred to as "microcontroller 104") includes embedded memory 109 (e.g., flash memory).

To facilitate testing, the integrated circuits 104, 105 and 108 may be coupled by a serial test interface 112, such as, for example, a boundary scan test interface that complies with IEEE (Institute of Electrical and Electronics Engineers) standard 1149.1 or 11491a—sometimes referred to as a "JTAG" interface (Joint Test Action Group interface). During testing, the serial test interface 112 may be coupled to a corresponding test interface 115 of a tester 116.

Through the serial test interface 112, the tester 116 may be able to verify the integrity of the manufacturing process of the PCB 101, or of various components on the PCB 101. In particular, the tester 116 may be able to verify component connectivity and component functionality. The tester 116, through the serial test interface 112, may test various components by placing the components into a known state, supplying known input data, and capturing the response of the components or of other components in the system to the known input data. The captured response may be compared to an expected response to verify functionality or connectivity. For example, test circuitry within the various components may respond to commands and test patterns from the serial test interface 112 to place component pins into a specific logic state or to capture the logic state of a component pin.

By using the test circuitry (not shown) in the first component 105 to place a pin 119 into a particular logic state, and by using test circuitry (not shown) in a second component 104 to capture a corresponding logic state of another pin 120 that is physically connected (or that should be physically connected) to the first component pin 119, the tester 116, using the serial test interface 112, may verify connectivity. This mode of testing may be particularly advantageous, for example, for testing internal functionality of components, or for testing connectivity between components on a dense PCB, where test access points may not be otherwise accessible (e.g., under a ball-grid array (BGA) component, such as component 108).

Functional testing may also be possible. For example, the tester may set various inputs of a circuit to a known state, and the tester may capture a logic state(s) of an output of the circuit in order to verify functionality. More particularly, the tester may set inputs of a circuit within the microcontroller 104 to a certain state (e.g., inputs 120 and 123), and capture state of a corresponding output 124. As another example, the tester 116 may verify functionality of internal blocks, such as, for example, the functional unit 127.

To place various components into a known state, test circuitry within a device under test (DUT) may receive a serial input stream (e.g., on the TDI line of a JTAG interface) of commands and test patterns. Test circuitry within the DUT may generate a corresponding serial output stream (e.g., on the TDO line of a JTAG interface) that may capture the state of components in response to the serial input stream. The input and output streams may be synchronized by a clock signal (e.g., the TCLK line of a JTAG interface), and the serial output stream may be compared to an expected serial output stream; if the streams match, the corresponding tests may be deemed to have been passed.

Connectivity and functional testing may be performed in a production test environment where integrated circuits or systems are presented for functional testing and configuration. For example, as shown in FIG. 1, the tester 116 may execute tests on individual components (e.g., integrated circuit components 104, 105 and 108) or on whole systems (e.g., PCB 101) using the serial test interfaces 115 and 112 and a corresponding serial test protocol (e.g., a JTAG boundary scan protocol). In particular, the tester 116 may connect to the serial test interface 112 through test probes or through a test connection 130.

In some implementations, the serial test interface 112 may also be used to program memory elements, such as the embedded flash 109, or to configure other programmable or configurable devices that are connected to the serial test interface 112. Some memory elements may require initialization or configuration prior to being programmed. For example, the embedded flash memory 109, may require initial configuration or cycling to dissipate charge that may have accumulated during a fabrication process. In some implementations, the serial test interface 112 may be used to perform this initial configuration or cycling process.

Generally, configuring or programming memory, such as the flash memory 109, is time-intensive relative to other testing. As such, it may be advantageous to configure the flash memory 109 concurrently with other testing (e.g., testing of connectivity of nets on the PCB 101 and other functional testing, such as testing of the component 105 and the functional unit 127). One way to facilitate concurrent memory configuration and other testing is to provide a flash controller (shown in FIG. 2) to configure the memory. In some implementations, the flash controller frees up the serial test interface 112 for other concurrent testing. Without such a flash controller, the tester 116 may need the serial test interface 112 to directly configure the memory, which may consume more test time. In some implementations, a parallel interface may be used in place of the serial interfaces 112 and 115 that are described above.

Figure 2:
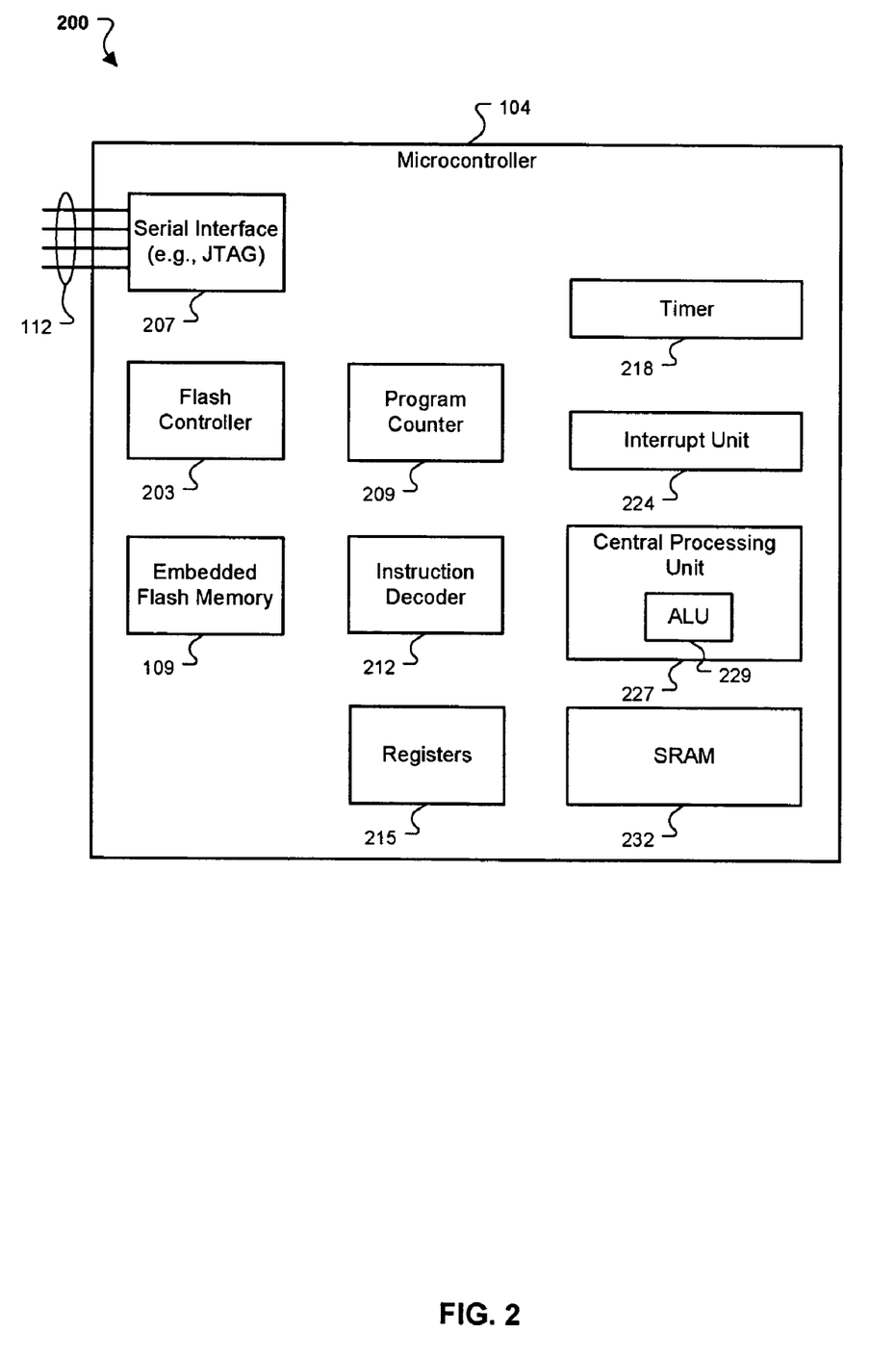
FIG. 2 is a block diagram of an exemplary microcontroller having embedded memory.

FIG. 2 is a block diagram of an exemplary microcontroller 104 that includes embedded flash memory 109, which can be configured or cycled via the serial test interface 112. The embedded flash memory 109 may be controlled by a flash controller 203, and the flash controller 203 may be connected to the serial test interface 112 by a serial interface 207 (e.g., a JTAG interface) in the microcontroller 104. The serial interface 207 may transfer data and commands to the flash controller 203, from the serial test interface 112 for configuration or cycling of the embedded flash memory 109.

The flash controller 203 generally manages reads and writes of data in the embedded flash memory 109. Reading from and writing to the flash memory may require a specific protocol, based on the internal architecture of the flash. More particularly, as is described in more detail with reference to FIG. 3, flash memory is generally arranged in pages, and flash is generally erased and written in page increments, through use of a page buffer. The flash controller 203 may track page boundaries and generally manage filling the page buffer and causing the page buffer to be written to a page of flash memory. The flash controller 203 may also be used to initially cycle or configure the embedded flash memory 109.

The embedded flash memory 109 may be programmed in a number of ways. For example, during operation of the microcontroller 104, program code that is executed by the microcontroller 104 may cause data to be stored in or retrieved from the embedded flash memory 109, through the flash controller 203. As another example, initial data may be received from the serial test interface 112 and stored in the embedded flash memory 109, through the flash controller 203.

Before data can be initially stored in the embedded flash memory 109, the embedded flash memory 109 may require initial cycling or configuration. This is because charge may accumulate in the embedded flash during the manufacturing process, and for the embedded flash memory 109 to function properly, the accumulated charge may need to be dissipated. Dissipating accumulated charge may require sequentially erasing and writing various data patterns to the embedded flash memory 109.

Certain data patterns may be particularly effective in dissipating accumulated charge. For example, one method of configuring embedded flash memory 109 may include erasing each page, writing a first pattern to each page (e.g., a "checkerboard pattern of alternating bits, such as 101010 . . . "), again erasing each page, writing a second pattern to each page (e.g., an "inverse checkerboard pattern" of alternating bits arranged as the inverse of the first pattern, such as "010101 . . . "), again erasing each page, writing a third pattern to each page (e.g., a pattern of all 0s), and again erasing each page in the embedded flash memory 109. Other patterns or combinations of patterns may be used in place of those just described, and a sequence of erase and write patterns may be repeated one or more times.

As shown in FIG. 2, the embedded flash memory 109 is included in a microcontroller 104. The microcontroller 104 includes various other functional units that are common to microcontrollers. In the example shown, the microcontroller 104 includes an instruction decoder 212 to initially process instructions, registers 215 to store operands used by instructions as they are executed, SRAM 232 to store data processed by the instructions, and various other functional units (e.g., a program counter 209, timer 218, interrupt unit 224, etc.) As shown, the microcontroller 104 also includes a central processing unit (CPU) 227, which itself includes an arithmetic logic unit (ALU) 229. The microcontroller 104 may include other units (not shown), such as, for example, analog units (e.g., output drivers or digital-to-analog converters), additional logic units or other memories. Devices having embedded flash memory may take many forms, and the exact form is not critical to this document.

Figure 3:
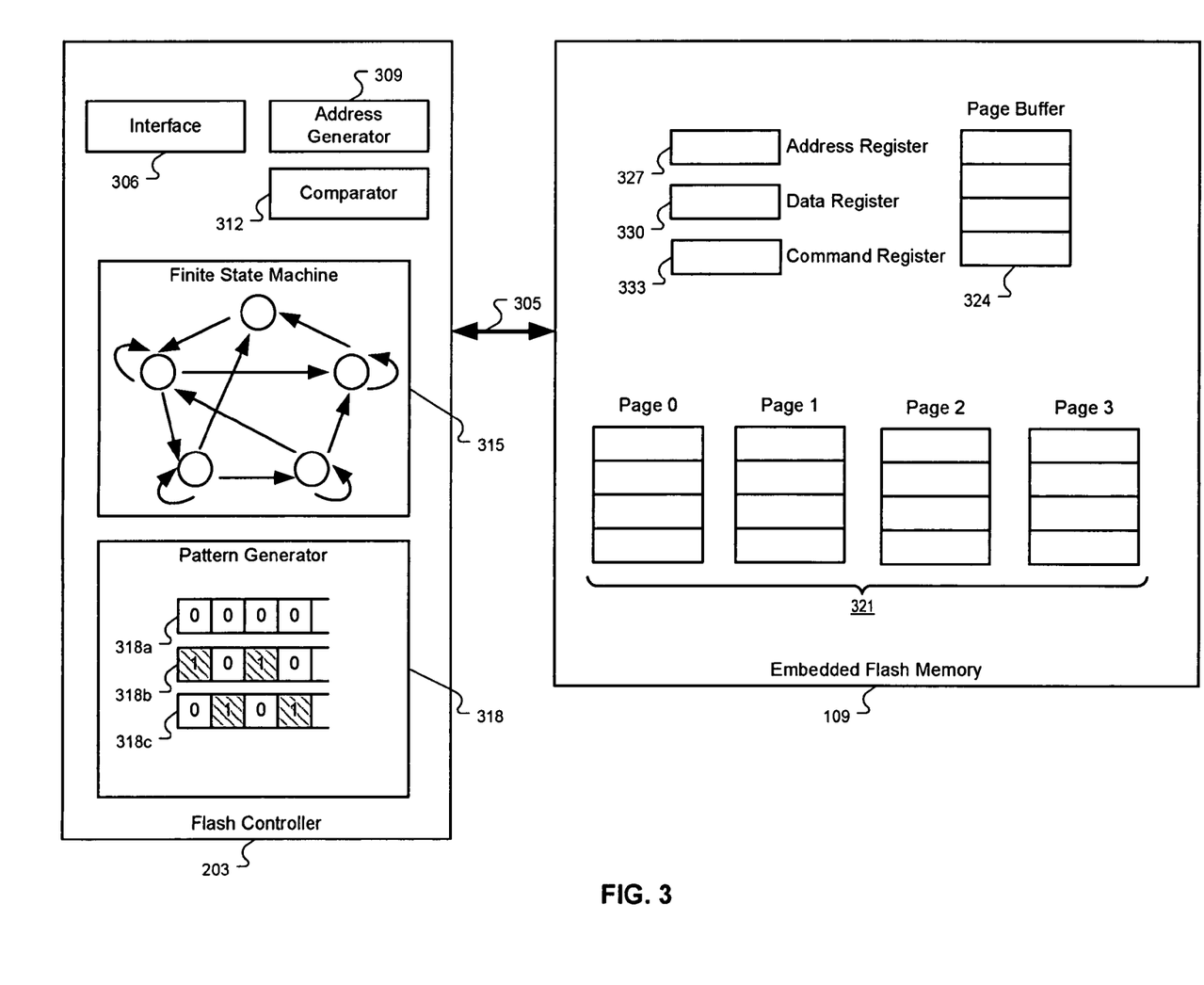
FIG. 3 is a block diagram of an example flash controller and flash memory.

FIG. 3 is a block diagram illustrating additional details of the embedded flash memory 109 and the flash controller 203 that are shown in FIG. 2. As described above, embedded flash memory 109 is generally arranged in "pages." As shown in FIG. 3, the embedded flash memory 109 has four pages 321, and each page has four words. FIG. 3 is simplified for the purposes of illustration. An actual flash device would generally have more pages, and each page would have more words. For example, a typical embedded flash memory may be arranged as 512 pages, where each page stores 512 bytes of data.

In addition, the embedded flash memory 109 has a page buffer 324 that is used to write data to the flash pages 321. The page buffer 324 generally has the same capacity as an individual page of the embedded flash memory 109, such that the page buffer 324 may fill one page of flash memory. Other sizes including larger and smaller sizes for the page buffer 324 are possible. Data is generally first written to the page buffer 324, and the contents of the page buffer are then transferred to a particular page 321.

The page buffer 324 may be indirectly accessed through registers. For example, the embedded flash memory 109 may include an address register 327, a data register 330 and a command register 333. Writing a word to the page buffer 324 may involve writing a value in the address register 327, specifying the word address within the page buffer 324; writing a data value in the data register 330, and writing a command that causes a state machine (not shown) within the embedded flash memory 109 to transfer the contents of the data register 330 to the word in the page buffer 324 that corresponds to the contents of the address register 327. This process may be repeated for each word in the page buffer 324, and when the page buffer 324 is full, it may be transferred to a page of memory. To transfer the page buffer 324 to a page of memory, an address of the page may be written to the address register 327, and a command may be written to the command register 333—the command specifying that the page buffer 324 is to be transferred to a page having an address that corresponds to the contents of the address register 327.

The embedded flash memory 109 may perform other operations in response to various other commands. For example, writing certain values to the address register 327 and command register 333 may cause the page buffer 324 to be erased. In response to other commands, individual pages may be erased, the entire device may be erased, values may be read, or other operations may be performed.

In some implementations, a word may be a single byte, and in some implementations, a word may be two or more bytes. The size of the registers 327, 330 and 333 may vary accordingly, and may further vary based on the width of a data bus 305 through which the embedded flash memory 109 is accessed. For example, in implementations with two-byte words and a one-byte bus 305, the data registers may each include two registers—a "high" register and a "low" register—and writing data to a page of memory may include additional cycles not described above.

The flash controller 203 may execute a sequence that includes erasing data in the embedded flash memory 109 and writing specific patterns. Such a sequence may be repeated several times in order to configure the embedded flash memory 109 by dissipating charge that may have accumulated during a fabrication process. In some implementations, to determine a number of sequences of erase and write operations necessary to configure the embedded flash memory 109, the flash controller 203 may measure a voltage associated with a flash write operation (e.g., voltage corresponding to an output of an internal charge pump (not shown) used in a flash write operation). The voltage may reflect a level of accumulated charge remaining in the embedded flash memory 109. In some implementations, a number of sequences of erase and write operations may be determined based on whether a pattern is successfully read back after having been written to the embedded flash memory 109. A comparator 312 may be used for this purpose. For example, if the pattern read back from the flash memory 109 matches the pattern written (as determined by the comparator 312), accumulated charge may be deemed to be sufficiently dissipated. If the pattern read back does not match the pattern written, the embedded flash memory may still include accumulated charge, and one or more additional sequences may be required to further dissipate the charge. If another sequence is needed, a finite state machine 315 may execute another sequence of erase and write operations.

To cycle or configure memory, the finite state machine 315 may employ a pattern generator 318 and an address generator 309. The pattern generator 318 may store or generate specific patterns that are useful to cycling the embedded flash memory 109, such as all zeros 318a, a checkerboard pattern 318b, or an inverse checkerboard pattern 318c. In some implementations, the pattern generator 318 may also store or generate an all 1s pattern (not shown); in other implementations, the finite state machine 315 may perform an erase operation to write all 1s to the embedded flash memory 109. The address generator 309 may be used to generate an address that appropriately identifies a word within the page buffer 324 or a page within the embedded flash memory 109. The address generator 309 may be a complex counter that increments based on the state of the finite state machine 315 and the internal architecture of the embedded flash memory 109. For each word of each page of the embedded flash memory device 109, the flash controller 203 may write an appropriate address value to the address register 327, a data value to the data register 330, and command value to the command register 333, in order to fill and transfer the page buffer 324 to each actual page of the embedded flash memory 109.

By employing the finite state machine 315 and the pattern generator 318, the flash controller 203 may free up devices outside of the flash controller from having to repeatedly write data to the embedded flash memory 109. For example, the flash controller 203 may initiate the above-described information process in response to a single command received via an interface 306, which may be coupled to the serial test interface 112 that is shown in the FIG. 2. The flash controller 203 may also free up external devices from having to write data in accordance with the particular internal architecture of the embedded flash memory 109. Rather, with a single command to the flash controller 203, a cycling operation for the embedded flash memory 109 may be automated, regardless of the internal architecture of the embedded flash memory 109 (details of which are instead captured in the finite state machine 315). Writing the single command to the flash controller 203 may be completed in one bus cycle. (One bus cycle generally refers to a single transaction between two processing units; thus, in one bus cycle, the finite state machine 315 in the flash controller 203 can write a value to one register in the embedded flash memory 109.)

Since the single command may invoke the flash controller 203 to begin cycling memory, further bus cycles (external to the flash controller 203) may be unnecessary to actually carry out the memory configuration. Therefore, other testing external to the flash controller 203 may be performed substantially concurrently with the flash configuration.

Use of the flash controller 203 as described above may significantly free up a serial interface, which may otherwise be used to cycle memory. In addition, the flash controller 203 may provide a level of "abstraction," that hides the internal architecture of the embedded flash memory 109 from devices external to the flash controller 203. That is, devices outside of the flash controller 203 may not need to track words within a page buffer or pages within an embedded flash memory device.

Figure 4:
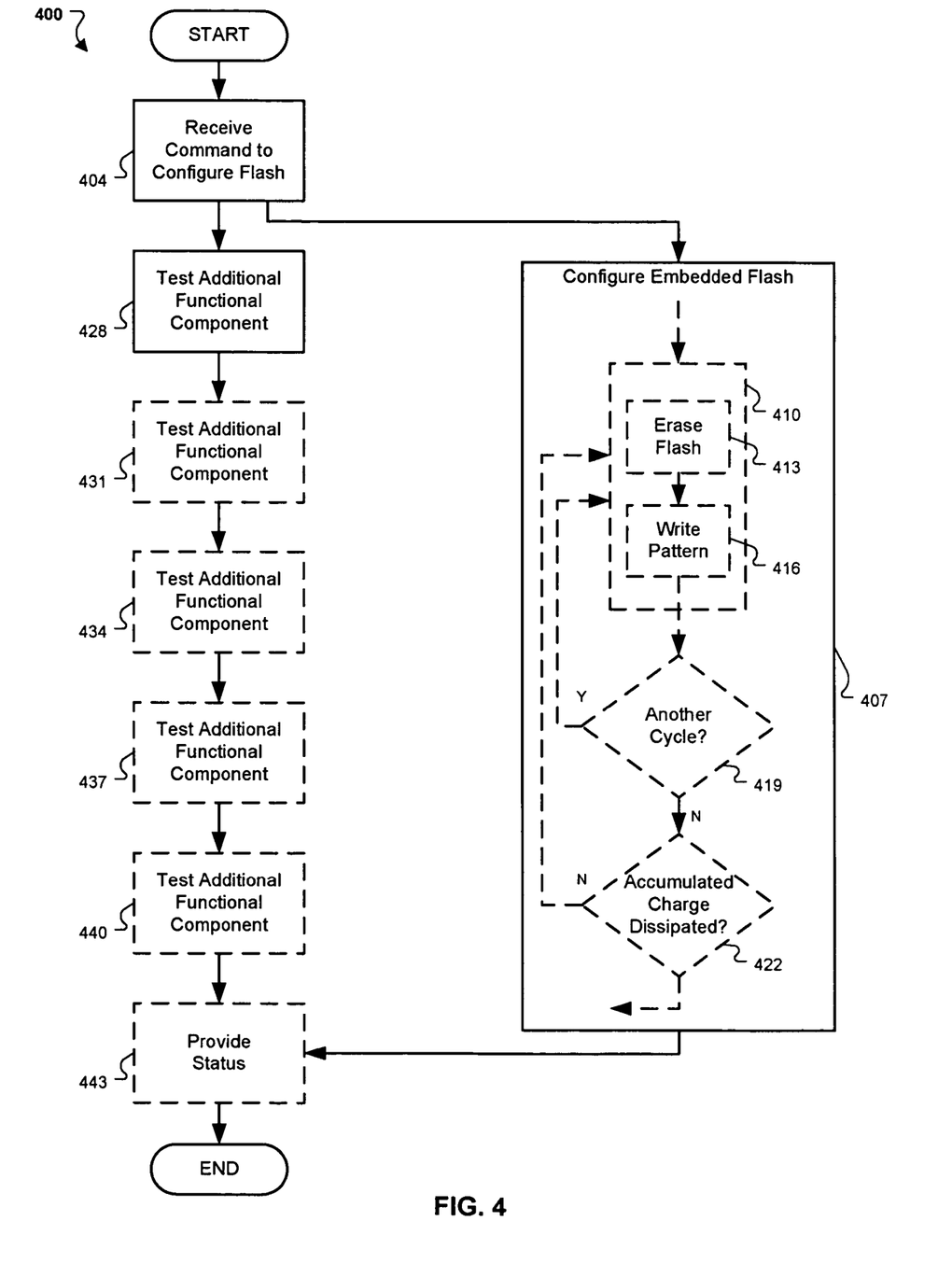
FIG. 4 is a flow diagram of a method for concurrently configuring flash memory and performing other testing.

FIG. 4 is a flow diagram of a method for concurrently configuring flash memory and performing other testing. Referring to FIG. 1, the method 400 may be used to initiate configuration of the embedded flash memory 109 from the serial test interface 112, while substantially concurrently testing other functional units, such as, for example, the functional unit 127 within the microcontroller 104, or the component 105.

The method includes receiving a command to configure flash memory (404). For example, the tester 116 (shown in FIG. 1) may issue a command via the serial interfaces 115 and 112 to configure the embedded flash memory 109; the command may be appropriately formatted such that it is relayed to the microcontroller 104; and the command may be received by the interface 306 in the flash controller 203 (see FIGS. 2 and 3).

The method 400 configures the embedded flash memory 109 (407). For example, receipt of the command by the flash controller 203 may cause the finite state machine 315 to begin configuring the embedded flash memory 109 (410). More particularly, the finite state machine 315 may cause appropriate values to be written to registers 327, 330 and 333 to cause each page 321 of the embedded flash memory 109 to be erased (413). Subsequently, the finite state machine 315 may cause appropriate values to be written to the registers 327, 330, and 333 to cause specific data patterns to be written (416)

to each page 321 of flash memory 109. The finite state machine 315 may cause the pattern generator 318 to generate, or otherwise provide, a data pattern for the flash memory 109. The provided data may be loaded into flash pages 321 by being first written to the page buffer 324 through appropriate writes to the address register 327, data register 330 and command register 333, as controlled by the finite state machine 315. To generate appropriate addresses, the finite state machine 315 may employ the address generator 309.

In some implementations, the sequence 410 of erasing (413) the flash and writing (416) a pattern may be automatically repeated (419) a predetermined number of times. For example, the flash 109 may first be erased (413), then written (416) with an all 0s pattern 318a, then erased (413), then written (416) with a checkerboard pattern 318b, then erased (413), then written (416) with an inverse-checkerboard pattern.

In some implementations, the entire example erase-write-erase-write-erase-write sequence may also be repeated a variable number of times. The variable number may depend on whether accumulated charge from a fabrication process of the flash memory 109 has been sufficiently dissipated. Whether any accumulated charge has been sufficiently dissipated may be determined (422) in a number of ways. In some implementations, a voltage may be measured that is associated with a charge pump (not shown) internal to the embedded flash memory 109. Accumulated charge that has not been sufficiently dissipated may affect this voltage. Thus, if the voltage is within one range, the finite state machine 315 may determine (422) that accumulated charge has not been sufficiently dissipated; if the measured voltage is within another range, the accumulated charge may be deemed to have been dissipated, and the sequence may not be repeated.

In some implementations, other methods may be used to determine (419) whether to repeat the example erase-write (or e.g., erase-write-erase-write-erase-write) sequence. For example, the finite state machine 315 may cause data to be read back from the embedded flash memory 109 and compared, by the comparator 312, to the last data pattern written to the flash memory 109. If the pattern read back does not match the last-written pattern, the finite state machine 315 may execute another example sequence. As another example, the sequence may simply be repeated a predetermined number of times. More particularly, the sequence of erasing (413), writing (416) an all 0s pattern 318a, erasing (413), writing (416) a checkerboard pattern 318b, erasing (413), and writing (416) an inverse-checkerboard pattern 318c may be repeated, for example, five times. In some implementations, the predetermined number of times may be hard-coded into the finite state machine 315, based on, for example, initial empirical testing of particular flash memory, during the design and verification of the particular embedded flash memory 109. In some implementations, the predetermined number of times may be specified in a command that is received by the flash controller 203 to configure the embedded flash memory 109. For example, the flash controller 203 may receive, via the serial interface 112 and the interface 306, a command having the format CYCLE_FLASH n, where n specifies a number of predetermined sequences to execute.

Substantially concurrently with the action 407 configuring the embedded flash memory 109, the method 400 tests or otherwise commands, monitors or interfaces with (428) at least one additional functional unit. For example, while the flash controller 203 is configuring the embedded flash memory 109 in response to a command received from the serial test interface 112, other commands may be received over the same serial test interface 112 to test one or more other functional units (428). More specific examples are now provided. For example, the tester 116 may test, via the serial interfaces 115 and 112, functionality of the component 105 (431). Alternatively, the tester 116 may test functionality of a functional unit 127 that is internal to the device 104, which includes the embedded flash memory 109 (E.g., SRAM 232) (434). The tester 116 may test functionality of another functional unit internal to the device 104 (e.g., the instruction decoder 212) (437). The tester 116 may test connectivity between various components (e.g., connectivity between pin 119 and pin 120) (440). (Note that as used herein, "functional component" includes PCB traces or other connections between devices whose connectivity may be verified through testing, such as boundary scan testing or direct-probe testing (e.g., with a "bed-of-nails" test fixture)).

The method 400 may provide status of the configuration and testing (443). For example, in some implementations, after the flash memory is configured and at least one of other functional components are tested (428-440), status may be provided, for example, via the serial test interface 112, or through a status bit or status signal. In some implementations, failure of the configuration process 407 or of any other test 428-440 may cause the method 400 to immediately provide (443) status and/or terminate, rather than continuing on with other tests.

Embodiments may be implemented, at least in part, in hardware or software or in any combination thereof. Hardware may include, for example, analog, digital or mixed-signal circuitry, including discrete components, integrated circuits (ICs), or application-specific ICs (ASICs). Embodiments may also be implemented, in whole or in part, in software, firmware or microcode, which may cooperate with hardware. Processors for executing instructions may retrieve instructions from a data storage medium, such as EPROM, EEPROM, NVRAM, ROM, RAM, a CD-ROM, a HDD, and the like. Computer program products may include storage media that contain program instructions for implementing embodiments described herein.

A number of embodiments have been described. Nevertheless, it will be understood that various modifications may be made without departing from the spirit and scope of this disclosure. For example, certain patterns of data and certain sequences are described above for purposes of illustration only; other patterns or sequences may also be used. As another example, embodiments may include a parallel test or programming interface in place of a serial interface. Accordingly, other embodiments are within the scope of the following claims.

What is claimed is:

1. A method comprising:
receiving, from a serial interface, a first command to cycle an embedded memory of an integrated circuit;
cycling the embedded memory with an embedded memory controller in response to receiving the first command;
during the cycling of the embedded memory, receiving a second command from the serial interface to test at least one functional unit of the integrated circuit; and
executing the second command to test the at least one functional unit while cycling of the embedded memory.

2. The method of claim 1, where cycling the embedded memory comprises:
(a) initiating erasure of the embedded memory;
(b) initiating writing of data having a first pattern to the embedded memory;
(c) initiating erasure of the embedded memory;

(d) initiating the writing of data having a second pattern to the embedded memory, wherein the first pattern and the second pattern are different;
(e) measuring a voltage level associated with initiating the writing of data; and
(f) repeating (a)-(e) until a voltage level associated with initiating the writing of data crosses a predetermined threshold level.

3. The method of claim 1, further comprising determining whether to repeat a sequence of writes to the embedded memory based on whether a charge is dissipated in the embedded memory.

4. The method of claim 1, further comprising determining whether charge accumulated in the embedded memory during a fabrication process is dissipated.

5. The method of claim 4, where determining whether the charge is dissipated comprises writing data having a test pattern to the embedded memory, reading data back from the embedded memory, and determining whether the data read back from the embedded memory exactly corresponds to the test pattern.

6. The method of claim 1, where the at least one functional unit is selected from the group consisting of an instruction decoder, a program counter, a timer, a comparator, an interrupt unit, an arithmetic logic unit (ALU), a microcontroller, an analog unit, an additional logic unit, and a memory; and where testing the at least one functional unit comprises configuring the at least one functional unit or verifying that the at least one functional unit was properly fabricated.

7. The method of claim 1, where the serial interface is a boundary scan interface that complies with IEEE (Institute of Electrical and Electronic Engineers) Standard 1149.1-1990 or 1149.1a-1993.

8. The method of claim 1, where the embedded memory is flash memory.

9. The method of claim 8, further comprising providing status output after completing cycling of the embedded memory and executing the second command.

10. The method of claim 9, where cycling the flash memory comprises:
cycling flash memory having at least 4096 bytes;
executing the second command to test the at least one functional unit comprises testing a reduced instruction set microcontroller; and
providing status output comprises providing status output within 200 milliseconds (mS) of receiving the command to cycle the flash memory, the status output specifying that all accumulated charge has been dissipated by cycling the embedded memory and further specifying that the reduced instruction set microcontroller has passed a functional test.

11. A method comprising:
receiving via a serial interface a command to configure a flash memory;
configuring a flash memory with an embedded flash memory controller;
receiving test commands and test patterns via the serial interface, the test commands and test patterns configured to test a functional unit that is separate from the flash memory; and
testing the functional unit while configuring the flash memory, the testing comprising executing the test commands and propagating the test patterns.

12. The method of claim 11, where configuring the flash memory comprises executing one or more sequences of initiating erasure of the flash memory and initiating writing of data having a specific pattern to the flash memory.

13. The method of claim 12, where the specific pattern is selected from the group consisting of an all 0s pattern, a checkerboard pattern, and an inverse-checkerboard pattern.

14. The method of claim 12, where executing one or more sequences comprises
(a) initiating erasure of the flash memory;
(b) initiating the writing of data having a first pattern to the flash memory;
(c) initiating erasure of the flash memory;
(d) initiating the writing of data having a second pattern to the flash memory, wherein the first pattern and the second pattern are different; and
(e) repeating (a)-(d) until charge accumulated in the flash memory during a fabrication process is dissipated.

15. The method of claim 11, further comprising determining whether charge accumulated in the flash memory during a fabrication process is dissipated.

16. The method of claim 15 where determining whether charge accumulated in the flash memory during a fabrication process is dissipated comprises measuring a voltage level associated with initiating writing of data.

17. The method of claim 15, where determining whether the charge is dissipated comprises writing data having a test pattern to the embedded memory, reading data back from the embedded memory, and determining whether the data read back from the embedded memory exactly corresponds to the test pattern.

18. A method comprising:
receiving, from a serial interface, a first command to cycle an embedded memory of an integrated circuit;
cycling the embedded memory with an embedded memory controller in response to receiving the first command;
during the cycling of the embedded memory, receiving a second command from the interface to test at least one functional unit of the integrated circuit; and
executing the second command to test the at least one functional unit while cycling of the embedded memory.

19. The method of claim 18, where cycling the embedded memory comprises:
(a) initiating erasure of the embedded memory;
(b) initiating writing of data having a first pattern to the embedded memory;
(c) initiating erasure of the embedded memory;
(d) initiating the writing of data having a second pattern to the embedded memory, wherein the first pattern and the second pattern are different;
(e) measuring a voltage level associated with initiating the writing of data; and
(f) repeating (a)-(e) until a voltage level associated with initiating the writing of data crosses a predetermined threshold level.

* * * * *

UNITED STATES PATENT AND TRADEMARK OFFICE
CERTIFICATE OF CORRECTION

PATENT NO. : 7,610,528 B2  Page 1 of 1
APPLICATION NO. : 11/353873
DATED : October 27, 2009
INVENTOR(S) : Marc Laurent and Frode Milch Pedersen It is certified that error appears in the above-identified patent and that said Letters Patent is hereby corrected as shown below:

Column 1, Line 61; replace:
"having embedded flash memory ma y be part of a larger" with
--having embedded flash memory may be part of a larger--

Column 4, Line 8; replace:
"dard 1149.1 or 11491a—sometimes referred to as a "JTAG"" with
--dard 1149.1 or 1149.1a—sometimes referred to as a "JTAG"--

Column 10, Line 61; replace:
"functional unit while cycling of the embedded memory."
--functional unit while cycling the embedded memory.--

Signed and Sealed this

Twelfth Day of January, 2010

David J. Kappos
*Director of the United States Patent and Trademark Office*